(12) United States Patent
Ichikawa

(10) Patent No.: US 12,047,060 B2
(45) Date of Patent: Jul. 23, 2024

(54) DRIVE DEVICE FOR VOLTAGE-CONTROLLED SEMICONDUCTOR ELEMENT

(71) Applicant: FUJI ELECTRIC CO., LTD., Kawasaki (JP)

(72) Inventor: Hiroaki Ichikawa, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 69 days.

(21) Appl. No.: 17/994,131

(22) Filed: Nov. 25, 2022

(65) Prior Publication Data

US 2023/0088396 A1 Mar. 23, 2023

Related U.S. Application Data

(63) Continuation of application No. PCT/JP2021/040996, filed on Nov. 8, 2021.

(30) Foreign Application Priority Data

Dec. 17, 2020 (JP) ................................. 2020-209306

(51) Int. Cl.
*H03K 17/14* (2006.01)
*G01R 31/26* (2020.01)
(Continued)

(52) U.S. Cl.
CPC ......... *H03K 17/14* (2013.01); *G01R 31/2607* (2013.01); *H03K 17/08* (2013.01);
(Continued)

(58) Field of Classification Search
CPC ........ H03K 17/14; H03K 17/08; H03K 17/18; H03K 17/28; H03K 19/20; H03K 2217/0018; G01R 31/2607
(Continued)

(56) References Cited

U.S. PATENT DOCUMENTS 10,097,174 B2 * 10/2018 Chen .................... H03K 17/687
2013/0177041 A1 7/2013 Sundaramoorthy et al.
(Continued)

FOREIGN PATENT DOCUMENTS

EP 2615467 A1 7/2013
EP 3270513 A1 1/2018
(Continued)

OTHER PUBLICATIONS

International Search Report for PCT/JP2021/040996, mailed on Feb. 1, 2022.

(Continued)

*Primary Examiner* — Ryan Johnson
*Assistant Examiner* — Colleen J O Toole
(74) *Attorney, Agent, or Firm* — Rabin & Berdo, P.C.

(57) ABSTRACT

A drive device for driving a voltage-controlled semiconductor element. The drive device includes: a drive circuit connected to the gate of the semiconductor element via a gate resistor; a delay circuit connected to the drive circuit, for delaying a drive signal output from the drive circuit until a gate voltage of the semiconductor element enters a Miller effect period, which is a period during which the gate voltage transitionally changes, the gate voltage having temperature dependency on a chip temperature of the semiconductor element; a one-shot circuit connected to the delay circuit, for outputting a pulse signal with a pulse width shorter than the Miller effect period; a comparator that compares the gate voltage with a reference voltage; and an AND circuit that outputs an overheat detection signal in response to the gate voltage exceeding the reference voltage.

6 Claims, 5 Drawing Sheets

(51) Int. Cl.
*H03K 17/08* (2006.01)
*H03K 17/18* (2006.01)
*H03K 17/284* (2006.01)
*H03K 19/20* (2006.01)

(52) U.S. Cl.
CPC .......... *H03K 17/18* (2013.01); *H03K 17/284* (2013.01); *H03K 19/20* (2013.01)

(58) Field of Classification Search
USPC .................................... 327/378, 512, 513
See application file for complete search history.

(56) References Cited

U.S. PATENT DOCUMENTS

| | | | |
|---|---|---|---|
| 2015/0372678 A1 | 12/2015 | Zhang et al. | |
| 2018/0013416 A1 | 1/2018 | Sicard | |
| 2018/0115310 A1* | 4/2018 | Horiguchi | H03K 17/168 |
| 2018/0234088 A1 | 8/2018 | Narayanasamy et al. | |

FOREIGN PATENT DOCUMENTS

| | | |
|---|---|---|
| JP | H08-48140 A | 2/1996 |
| JP | 3075303 B2 | 8/2000 |
| JP | 2004-117111 A | 4/2004 |
| JP | 2013-142704 A | 7/2013 |
| JP | 2020-072569 A | 5/2020 |

OTHER PUBLICATIONS

Sebastian Hiller, Jianjie Zhang, Josef Lutz, "Estimating the chip temperature in an inverter by measuring the temperature sensitive Miller plateau during turn-off", PCIM Europe 2019 International Exhibition and Conference for Power Electronics, Intelligent Motion, Renewable Energy and Energy Management, May 7, 2019, pp. 1091-1096.

Written Opinion for PCT/JP2021/040994, mailed on Feb. 1, 2022.

* cited by examiner

DRIVE DEVICE FOR VOLTAGE-CONTROLLED SEMICONDUCTOR ELEMENT

CROSS-REFERENCE TO RELATED APPLICATION

This application is a continuation application of International Application PCT/JP2021/040996 filed on Nov. 8, 2021, which designated the U.S., which claims priority to Japanese Patent Application No. 2020-209306, filed on Dec. 17, 2020, the entire contents of which are incorporated herein by reference.

BACKGROUND OF THE INVENTION

1. Field of the Invention

The embodiments discussed herein relate to a drive device for a voltage-controlled semiconductor element, which detects the chip temperature of the voltage-controlled semiconductor element, and has a function of outputting the detected chip temperature to the outside.

2. Background of the Related Art

Some semiconductor devices control switching of inductive loads and perform power conversion. Such a semiconductor device may include a semiconductor switching element and a drive device that drives this semiconductor switching element. As the semiconductor switching element, a voltage-controlled semiconductor element such as an insulated gate bipolar transistor (IGBT) or metal-oxide semiconductor field-effect transistor (MOSFET) is used.

Voltage-controlled semiconductor elements have an allowable temperature specified in absolute maximum ratings. If a voltage-controlled semiconductor element operates at a temperature exceeding the maximum allowable temperature, a semiconductor chip may be damaged due to the heat. To prevent or avoid such heat damage in the semiconductor chip, the chip temperature is monitored, and when the chip temperature is estimated to be high, the voltage-controlled semiconductor element may be operated at the rated value or lower or may be stopped.

One known method of detecting a chip temperature of a voltage-controlled semiconductor element is to provide a thermistor inside a semiconductor device, detect the temperature inside the case, and estimate the chip temperature on the basis of the operating conditions. Another method is to integrally form a temperature detection diode on the chip of a voltage-controlled semiconductor element, and directly measure the chip temperature on the basis of the temperature characteristics of the temperature detection diode.

In the method of estimating a chip temperature using a thermistor, it is difficult to follow an abrupt temperature increase caused by an overcurrent due to load change since the thermistor is placed apart from the semiconductor chip. In the method of measuring a chip temperature using a temperature detection diode, the temperature detection diode is formed on the semiconductor chip, which reduces the active area of the semiconductor chip. In addition, a diode-dedicated electrode needs to be formed on the semiconductor chip, which further reduces the active area. Therefore, in the case of mounting a temperature detection diode on the chip of a semiconductor switching element with a low current rating, the chip size needs to be enlarged.

On the other hand, there have been proposed methods of detecting the temperature of the chip of a voltage-controlled semiconductor element without using a thermistor or temperature detection diode (see, for example, Japanese Laid-open Patent Publication No. 2013-142704 and Japanese Laid-open Patent Publication No. 2020-072569).

Japanese Laid-open Patent Publication No. 2013-142704 teaches a technique of detecting the duration of a Miller plateau phase when an IGBT is turned off, and converting the duration of the Miller plateau phase into a temperature, thereby detecting the temperature. That is, the technique of Japanese Laid-open Patent Publication No. 2013-142704 determines the junction temperature of the IGBT from the time delay of the Millar plateau, using the feature that the time delay of the Miller plateau and the junction temperature of the IGBT have interdependency.

Japanese Laid-open Patent Publication No. 2020-072569 teaches a technique of measuring a time change of a gate voltage during a switching operation of a semiconductor device, and estimating the temperature of the semiconductor device on the basis of the measured time change of the gate voltage, using the feature that the time change of the gate voltage has temperature dependency on the temperature of the semiconductor device.

However, the technique taught in Japanese Laid-open Patent Publication No. 2013-142704 has the following problem: it is difficult to accurately detect a Miller effect period that is a time delay of Miller plateau. In addition, as the technique taught in Japanese Laid-open Patent Publication No. 2020-072569 is to measure the rise time of a gate voltage and calculate the temperature of the semiconductor device corresponding to the rise time of the gate voltage by the use of a microcomputer with reference to temperature dependency information, this technique has a problem that is an increase in the size of the drive device.

SUMMARY OF THE INVENTION

According to an aspect, there is provided a drive device for driving a voltage-controlled semiconductor element having a gate. The drive device includes: a drive circuit that is connected to the gate of the voltage-controlled semiconductor element via a gate resistor provided therebetween; a delay circuit connected to the drive circuit, the delay circuit being configured to delay a drive signal output from the drive circuit by a predetermined period of time until a gate voltage of the voltage-controlled semiconductor element enters a Miller effect period, the Miller effect period being a period during which the gate voltage transitionally changes, the gate voltage having temperature dependency on a chip temperature of the voltage-controlled semiconductor element; a one-shot circuit connected to the delay circuit, the one-shot circuit being configured to output a pulse signal with a pulse width shorter than the Miller effect period; a comparator that compares the gate voltage with a reference voltage; and an AND circuit that receives the pulse signal output from the one-shot circuit and an output signal of the comparator, and outputs an overheat detection signal in response to the output signal indicating that the gate voltage exceeds the reference voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
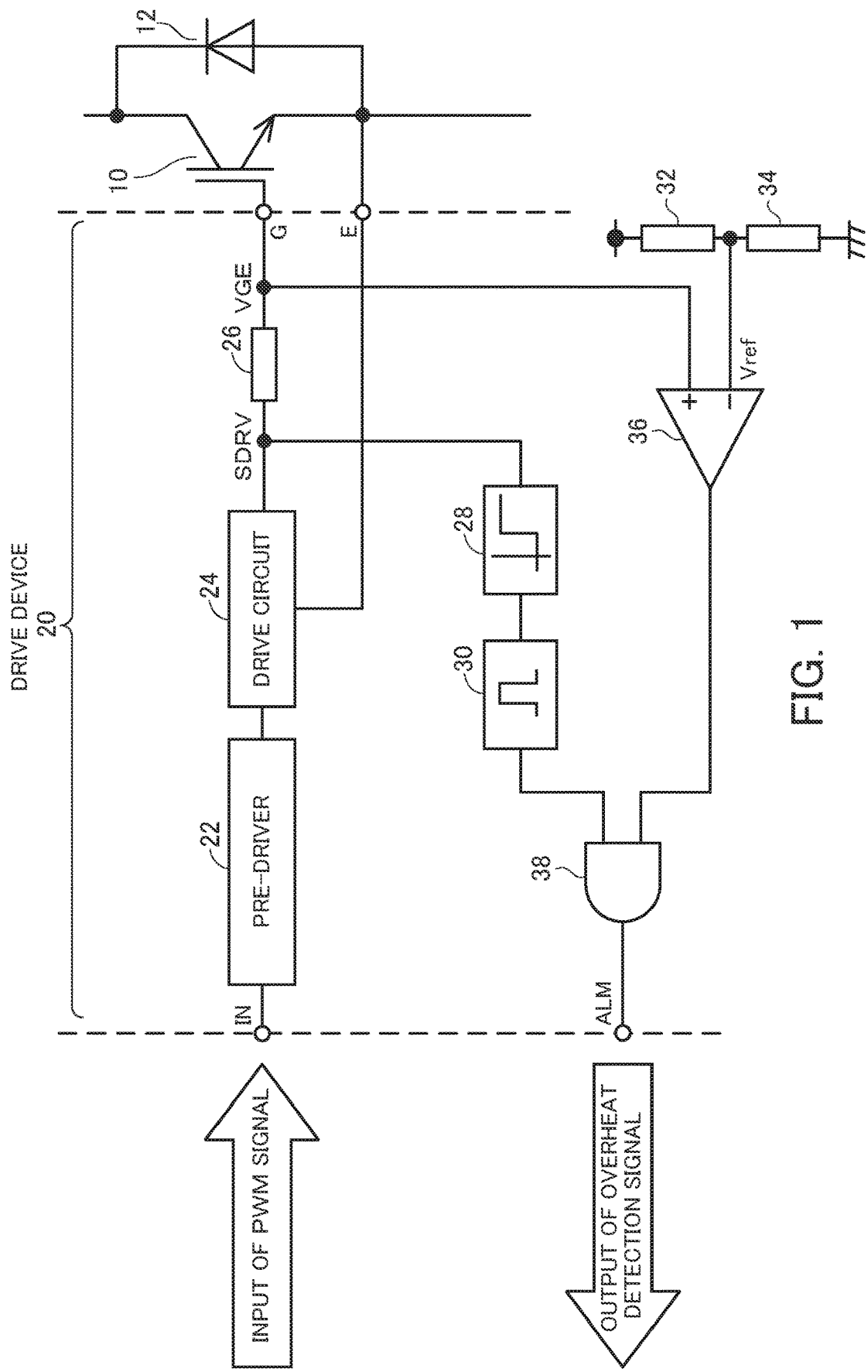
FIG. 1 is a circuit diagram illustrating an example of the configuration of a drive device for an insulated gate bipolar transistor (IGBT) according to a first embodiment.

Hereinafter, embodiments will be described in detail with reference to the accompanying drawings, giving example cases in which an insulated gate bipolar transistor (IGBT) is used as a voltage-controlled semiconductor element and a drive device drives the IGBT. In this connection, the same reference numerals are used in the drawings to refer to the same components.

Figure 2:
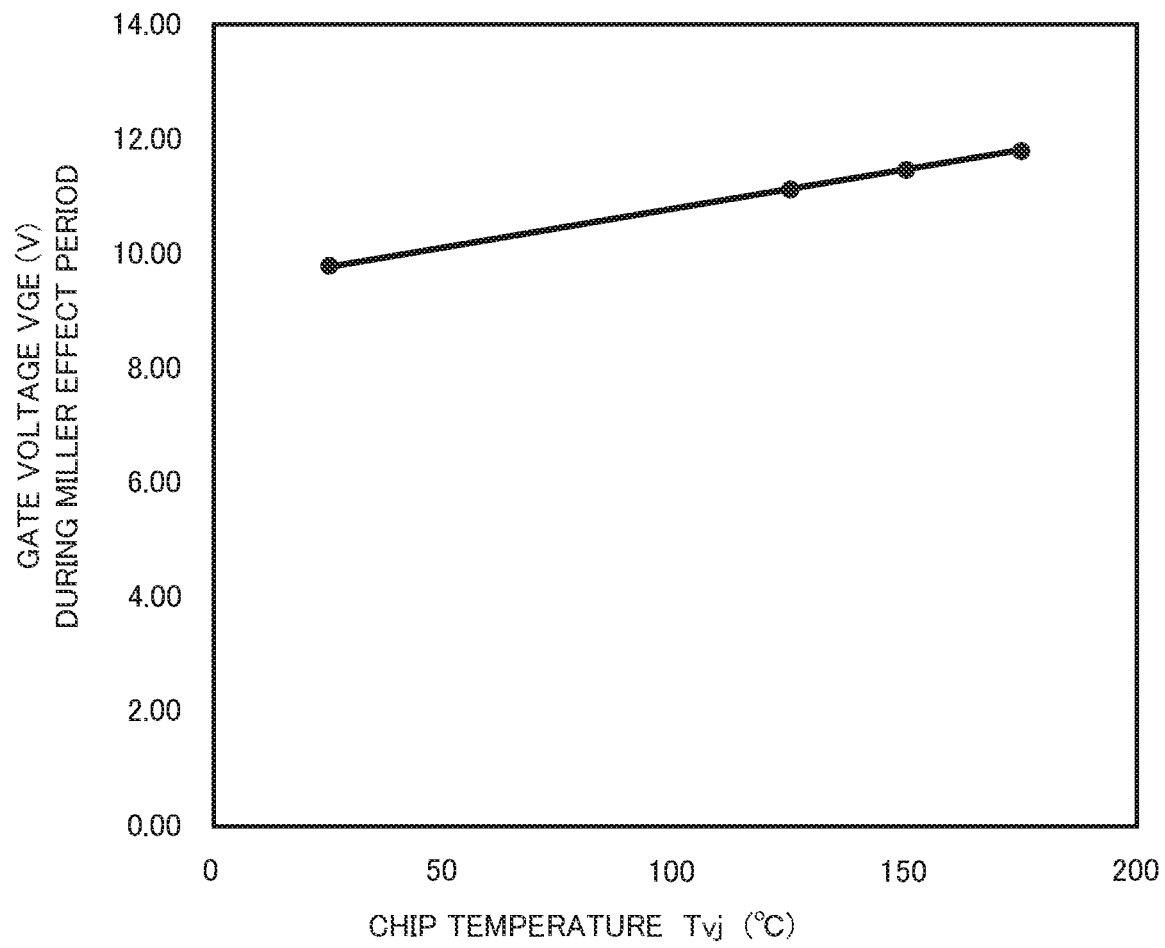
FIG. 2 illustrates the relationship between gate voltage during a Miller effect period and chip temperature.
Figure 3:
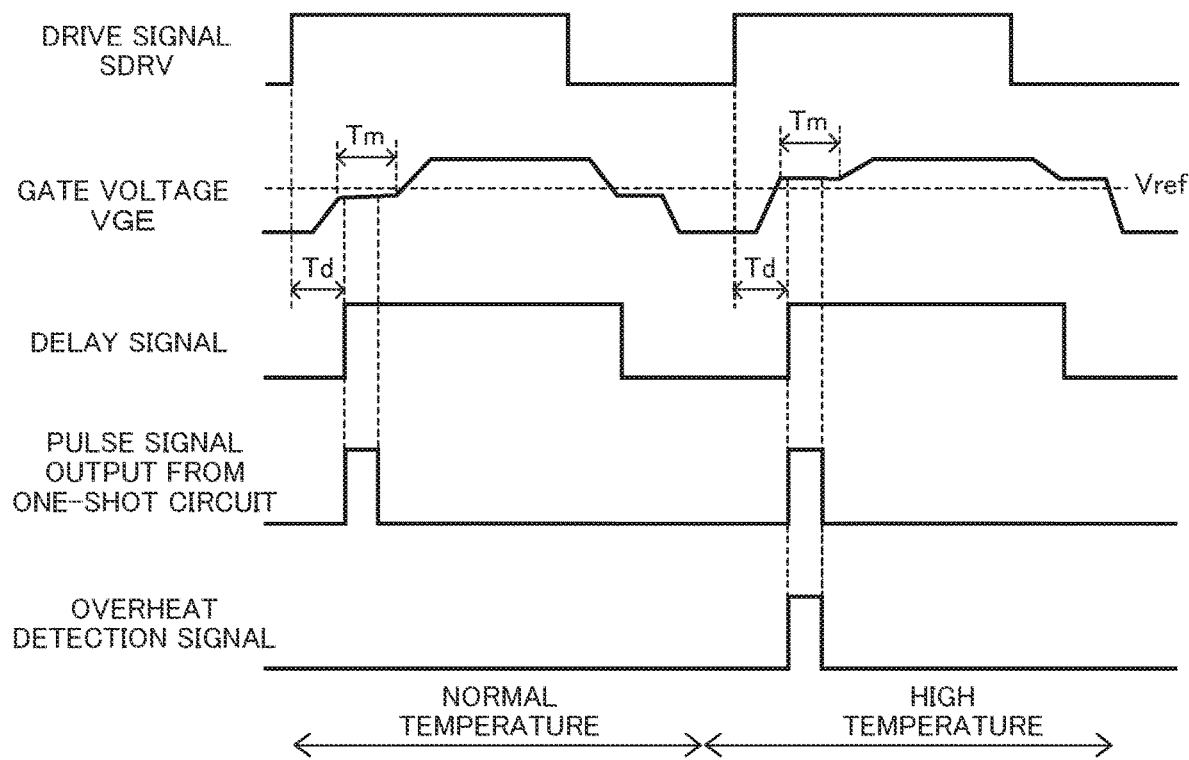
FIG. 3 is a time chart for describing the operation of the drive device for the IGBT according to the first embodiment.

FIG. 1 is a circuit diagram illustrating an example of the configuration of a drive device for an IGBT according to a first embodiment, FIG. 2 illustrates the relationship between gate voltage during a Miller effect period and chip temperature, and FIG. 3 is a time chart for describing the operation of the drive device for the IGBT according to the first embodiment.

FIG. 1 illustrates an IGBT 10 that is a semiconductor switching element and a drive device 20 that drives this IGBT 10. For example, the IGBT 10 and drive device 20 are accommodated in one package to form a semiconductor device called an "intelligent power module."

A free-wheeling diode (FWD) 12, which is a device that allows energy stored in an inductive load to flow to the power supply side when the IGBT 10 is turned off, is connected in anti-parallel to the IGBT 10. That is, the anode of the FWD 12 is connected to the emitter of the IGBT 10, and the cathode of the FWD 12 is connected to the collector of the IGBT 10.

The drive device 20 includes a pre-driver 22, a drive circuit 24, and a gate resistor 26. The pre-driver 22 has a terminal IN to which a pulse width modulation (PWM) signal is input from an external higher-level device. The output terminal of the pre-driver 22 is connected to the input terminal of the drive circuit 24. The output terminal of the drive circuit 24 is connected to one terminal of the gate resistor 26, and the other terminal of the gate resistor 26 is connected to a terminal G that is connected to the gate of the IGBT 10. The drive circuit 24 is also connected to a terminal E that is connected to the emitter of the IGBT 10. The PWM signal input to the terminal IN is converted to a drive signal SDRV by the pre-driver 22 and drive circuit 24, and the drive signal SDRV is turned into a gate voltage VGE through the gate resistor 26, and the gate voltage VGE is supplied to the terminal G.

In addition, the drive device 20 includes a delay circuit 28, a one-shot circuit 30, resistors 32 and 34, a comparator 36, and an AND circuit 38. The input terminal of the delay circuit 28 is connected to the connection point between the output terminal of the drive circuit 24 and the one terminal of the gate resistor 26, and the output terminal of the delay circuit 28 is connected to the input terminal of the one-shot circuit 30. One terminal of the resistor 32 is connected to a power supply line, and the other terminal of the resistor 32 is connected to one terminal of the resistor 34. The other terminal of the resistor 34 is connected to the ground. The resistors 32 and 34 form a voltage divider circuit and output a reference voltage Vref. The reference voltage Vref is equivalent to an overheat detection threshold voltage, and is for example, a voltage corresponding to 175° C. that is the upper limit of a guaranteed operating temperature range of the IGBT 10.

The non-inverting input terminal of the comparator 36 is connected to the connection point between the other terminal of the gate resistor 26 and the terminal G. The inverting input terminal of the comparator 36 is connected to the connection point between the other terminal of the resistor 32 and the one terminal of the resistor 34. The output terminal of the one-shot circuit 30 is connected to a first input terminal of the AND circuit 38, and the output terminal of the comparator 36 is connected to a second input terminal of the AND circuit 38. The output terminal of the AND circuit 38 is connected to an alarm output terminal ALM that sends an overheat detection signal to the external higher-level device.

In the IGBT 10, the gate voltage VGE during the Miller effect period at the turn-on has temperature dependency on the chip temperature Tvj of the IGBT 10. As illustrated in FIG. 2, the temperature dependency has characteristics in which the gate voltage VGE linearly changes with the chip temperature Tvj. Therefore, the chip temperature Tvj is detected from the gate voltage VGE.

The following describes the operation of the drive device 20 configured as above, with reference to the time chart of FIG. 3. The time chart of FIG. 3 illustrates, from the top, a drive signal SDRV output from the drive circuit 24, a gate voltage VGE between the gate resistor 26 and the terminal G, a delay signal output from the delay circuit 28, a pulse signal output from the one-shot circuit 30, and an overheat detection signal at the alarm output terminal ALM.

When a PWM signal is input to the terminal IN of the drive device 20, the PWM signal is input to the drive circuit 24 via the pre-driver 22, and is output from the drive circuit 24 as a drive signal SDRV. When this drive signal SDRV is applied to the gate of the IGBT 10 via the gate resistor 26, the gate voltage VGE changes as illustrated in FIG. 3.

When the drive signal SDRV rises from low (L) level to high (H) level, the gate-emitter capacity of the IGBT 10 is charged with the voltage of H level via the gate resistor 26. When the gate-emitter capacity is charged to a voltage exceeding an ON threshold voltage of the IGBT 10, the IGBT 10 is turned on, and the collector and the emitter of the IGBT 10 are approximately short-circuited. Thereby, the gate-emitter capacity and the gate-collector capacity (Miller capacity) are connected to the gate of the IGBT 10, and the IGBT 10 operates as a Miller integrator. During a Miller effect period Tm during which the IGBT 10 operates as the Miller integrator, the gate voltage VGE is kept constant. After the Miller effect period Tm ends, the gate voltage VGE rises to the H-level potential of the drive signal SDRV since the charge into the gate of the IGBT 10 still continues.

After the drive signal SDRV turns to L level, the gate voltage VGE changes in the opposite way to the way the gate voltage VGE changes when the IGBT 10 is turned on, so that the gate voltage VGE drops to the L-level potential of the drive signal SDRV.

The drive signal SDRV is also input to the delay circuit 28. The delay circuit 28 outputs a delay signal obtained by delaying the drive signal SDRV by a delay time Td. This delay time Td is a period of time from a rising edge of the drive signal SDRV to a certain time point in the Miller effect period Tm of the gate voltage VGE, and is determined based on the switching characteristics of the IGBT 10. The delay signal is input to the one-shot circuit 30, which then outputs a pulse signal having a fixed width from the rising edge of the delay signal. The pulse signal output from the one-shot circuit 30 has a pulse width shorter than the Miller effect period Tm and is to obtain the gate voltage VGE during the Miller effect period Tm.

The gate voltage VGE is also supplied to the non-inverting input terminal of the comparator 36. The comparator 36 receives the reference voltage Vref equivalent to the overheat detection threshold voltage at the inverting input terminal thereof. Therefore, the comparator 36 forms a binary circuit to determine whether the gate voltage VGE reaches the overheat detection threshold voltage. If the gate voltage VGE is less than the reference voltage Vref equivalent to the overheat detection threshold voltage, the comparator 36 outputs a signal of L level. If the gate voltage VGE is greater than or equal to the reference voltage Vref, the comparator 36 outputs a signal of H level.

The AND circuit 38 receives the pulse signal output from the one-shot circuit 30 at the first input terminal thereof, and receives an output signal from the comparator 36 at the second input terminal thereof. Therefore, the AND circuit 38 allows the output signal of the comparator 36 to pass therethrough only while receiving the pulse signal.

When the chip temperature of the IGBT 10 is a normal temperature within the guaranteed operating temperature range, the gate voltage VGE during the Miller effect period Tm is less than the reference voltage Vref, the comparator 36 outputs a signal of L level, and therefore the AND circuit 38 outputs a signal of L level.

When the chip temperature of the IGBT 10 is a high temperature exceeding the guaranteed operating temperature range, the gate voltage VGE during the Miller effect period Tm becomes greater than or equal to the reference voltage Vref. Therefore, the comparator 36 outputs a signal of H level, and the AND circuit 38 outputs a signal of H level. This signal of H level is given as an overheat detection signal from the alarm output terminal ALM to the external higher-level device.

In this connection, in this embodiment, the overheat detection signal is output from the alarm output terminal ALM to the outside. Alternatively, the overheat detection signal may be input to an overheat detection protection circuit, not illustrated, to forcibly turn off the IGBT 10.

Figure 4:
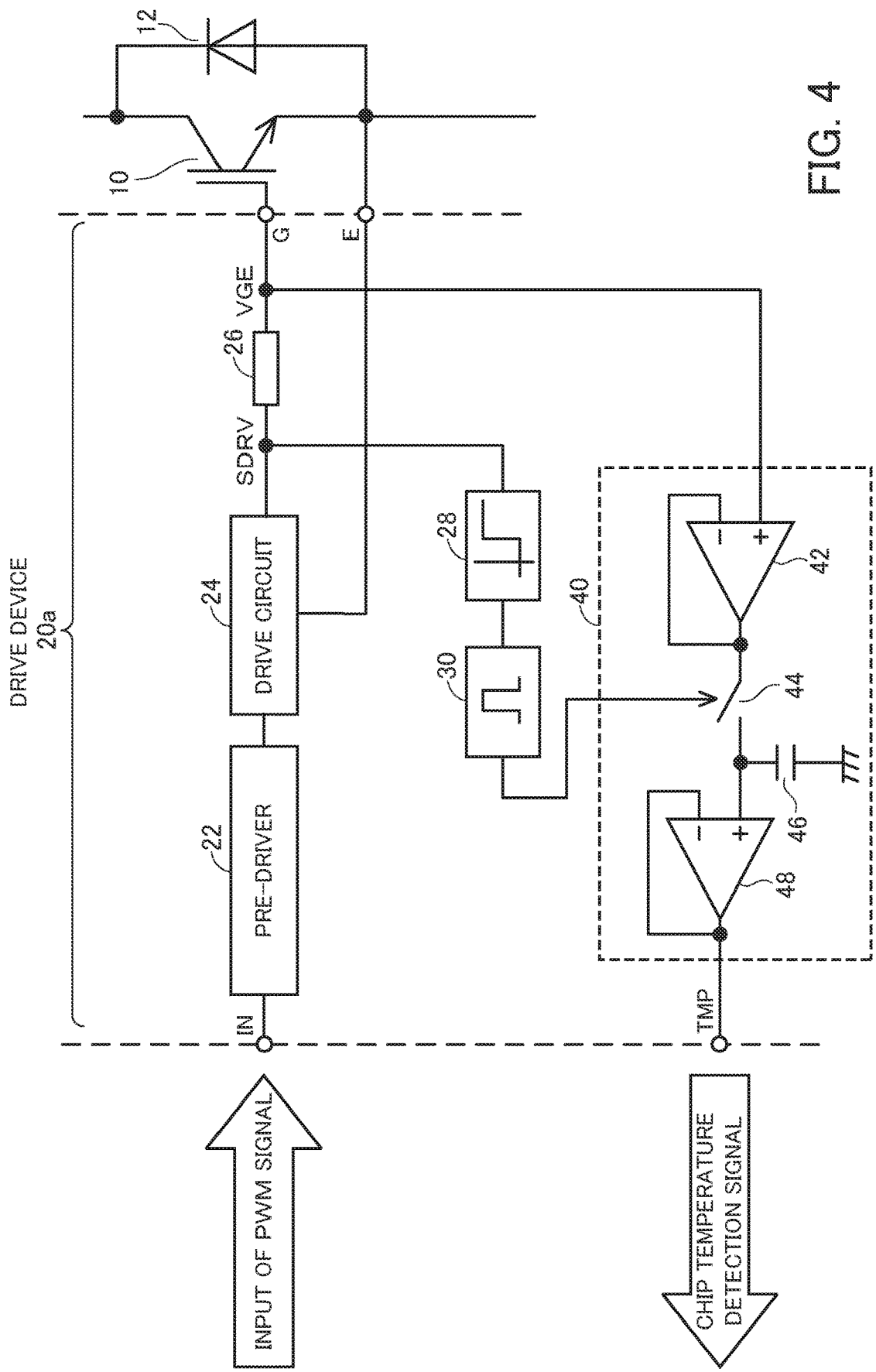
FIG. 4 is a circuit diagram illustrating an example of the configuration of a drive device for an IGBT according to a second embodiment.

FIG. 4 is a circuit diagram illustrating an example of the configuration of a drive device for an IGBT according to a second embodiment.

A drive device 20a for an IGBT 10 according to the second embodiment is configured so as to detect a chip temperature in real time and output it, in contrast to the configuration of the first embodiment in which the drive device 20 detects an overheat in the IGBT 10 and outputs an alarm.

The drive device 20a includes a pre-driver 22, a drive circuit 24, a gate resistor 26, a delay circuit 28, and a one-shot circuit 30. These are the same as those provided in the drive device 20 of the first embodiment, and so the detailed description of them will be omitted.

The drive device 20a also includes a sample-hold circuit 40. The sample-hold circuit 40 includes an operational amplifier 42, a switch element 44, a capacitor 46, and an operational amplifier 48. The operational amplifier 42 forms a voltage follower circuit in which the inverting input terminal thereof is connected to the output terminal thereof, and the non-inverting terminal of the operational amplifier 42 is connected to a terminal G that is connected to the gate of the IGBT 10. The output terminal of the operational amplifier 42 is connected to one terminal of the switch element 44, and the other terminal of the switch element 44 is connected to one terminal of the capacitor 46 and the non-inverting input terminal of the operational amplifier 48. The other terminal of the capacitor 46 is connected to the ground. The control terminal of the switch element 44 is connected to the output terminal of the one-shot circuit 30. The operational amplifier 48 forms a voltage follower circuit in which the inverting input terminal thereof is connected to the output terminal thereof. The output terminal of the operational amplifier 48 is connected to a chip temperature output terminal TMP.

The sample-hold circuit 40 of this drive device 20a is configured so that the gate voltage VGE is received by the operational amplifier 42 with a high input impedance in order to minimize the influence of the connection of the sample-hold circuit 40 to the terminal G. The operational amplifier 42 forms a voltage follower circuit, so that the gate voltage VGE received at the non-inverting input terminal is output as it is. When the switch element 44 receives a pulse signal of H level from the one-shot circuit 30 at the control terminal thereof, the switch element 44 is turned on (becomes conductive) while receiving the pulse signal, and applies a voltage (≈gate voltage VGE) output from the operational amplifier 42 to the capacitor 46. At this time, the terminal voltage of the capacitor 46 follows the voltage output from the operational amplifier 42.

When the pulse signal output from the one-shot circuit 30 turns to L level, the switch element 44 is turned off (becomes non-conductive), and the terminal voltage of the capacitor 46 remains at the voltage obtained when the switch element 44 is turned off. The voltage held in the capacitor 46 is output, as it is, as a chip temperature detection signal from the operational amplifier 48 forming the voltage follower circuit, and the chip temperature detection signal is given to an external higher-level device from the chip temperature output terminal TMP.

In this connection, when the external higher-level device receives the chip temperature detection signal from the drive device 20a, it obtains a chip temperature from the chip temperature detection signal. That is, the higher-level device has data defining the relationship between the gate voltage VGE during a Miller effect period and chip temperature Tvj illustrated in FIG. 2, and converts the gate voltage VGE indicated by the chip temperature detection signal into a chip temperature Tvj.

As described above, this drive device 20a is able to directly monitor the chip temperature of the IGBT 10 in real time. That is, it is possible to monitor the chip temperature with high accuracy and to achieve the detection of the chip temperature with a small-scale circuit configuration.

Figure 5:
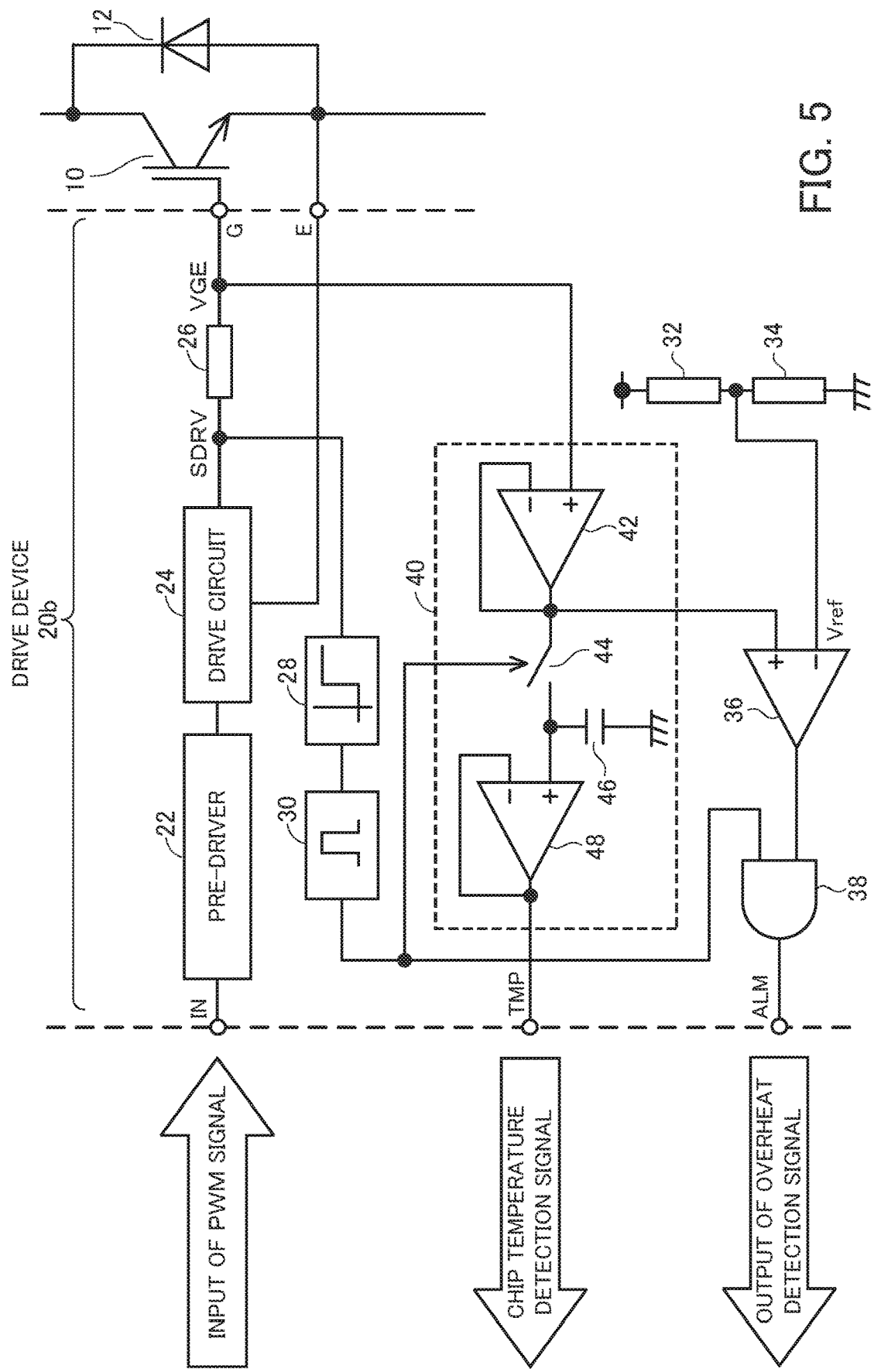
FIG. 5 is a circuit diagram illustrating an example of the configuration of a drive device for an IGBT according to a third embodiment.

FIG. 5 is a circuit diagram illustrating an example of the configuration of a drive device for an IGBT according to a third embodiment.

A drive device 20b for an IGBT 10 according to the third embodiment has the overheat detection function of the IGBT 10 provided in the drive device 20 of the first embodiment and the chip temperature detection function of the IGBT 10 provided in the drive device 20a of the second embodiment.

The drive device 20b includes a pre-driver 22, a drive circuit 24, a gate resistor 26, a delay circuit 28, a one-shot circuit 30, resistors 32 and 34, a comparator 36, an AND circuit 38, and a sample-hold circuit 40. These components of the drive device 20b are the same as those provided in the drive device 20 of the first embodiment and in the drive device 20a of the second embodiment. A distinctive feature is that a gate voltage VGE input to the non-inverting input terminal of the comparator 36 is obtained from the output terminal of the operational amplifier 42 of the sample-hold circuit 40.

As described above, this drive device 20b has the same components as the drive device 20 of the first embodiment and the drive device 20a of the second embodiment, and operates in the same manner as the drive devices 20 and 20a. Therefore, the detailed description of the drive device 20b will be omitted. This drive device 20b is able to achieve both overheat detection and temperature detection.

In this connection, in the above embodiments, a gate voltage VGE during a Miller effect period that occurs when the IGBT 10 is turned on is detected, and a chip temperature corresponding to the gate voltage VGE is obtained. Alternatively, a gate voltage VGE during a Miller effect period that occurs when the IGBT 10 is turned off or during Miller effect periods that occur when the IGBT 10 is turned on and turned off may be detected, and then a chip temperature may be obtained. In this case, the delay circuit 28 outputs a delay signal obtained by delaying the gate voltage VGE by a period of time from the falling edge of the drive signal SDRV to a certain time point in the Miller effect period Tm. In addition, the drive devices 20 and 20a may be designed to drive a MOSFET, in place of the IGBT 10.

Heretofore, one aspect of a drive device for a voltage-controlled semiconductor element has been described using the embodiments. The embodiments are merely examples and are not limited to the above disclosure.

A drive device for a voltage-controlled semiconductor element, as configured above, make it possible to directly monitor the chip temperature of the voltage-controlled semiconductor element in real time, so as to monitor the chip temperature with high accuracy. In addition, it is possible to achieve the detection of the chip temperature with a small-scale circuit configuration.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A drive device for driving a voltage-controlled semiconductor element having a gate, the drive device comprising:
   a drive circuit that is connected to the gate of the voltage-controlled semiconductor element via a gate resistor provided therebetween;
   a delay circuit connected to the drive circuit, the delay circuit being configured to delay a drive signal output from the drive circuit by a predetermined period of time until a gate voltage of the voltage-controlled semiconductor element enters a Miller effect period, the Miller effect period being a period during which the gate voltage transitionally changes, the gate voltage having temperature dependency on a chip temperature of the voltage-controlled semiconductor element;
   a one-shot circuit connected to the delay circuit, the one-shot circuit being configured to output a pulse signal with a pulse width shorter than the Miller effect period;
   a comparator that compares the gate voltage with a reference voltage; and
   an AND circuit that receives the pulse signal output from the one-shot circuit and an output signal of the comparator, and outputs an overheat detection signal in response to the output signal indicating that the gate voltage exceeds the reference voltage.

2. The drive device for driving the voltage-controlled semiconductor element according to claim 1, further comprising an alarm output terminal that outputs the overheat detection signal generated by the AND circuit.

3. A drive device for driving a voltage-controlled semiconductor element having a gate, the drive device comprising:
   a drive circuit that is connected to the gate of the voltage-controlled semiconductor element via a gate resistor provided therebetween;
   a delay circuit connected to the drive circuit, the delay circuit being configured to delay a drive signal output from the drive circuit by a predetermined period of time until a gate voltage of the voltage-controlled semiconductor element enters a Miller effect period, the Miller effect period being a period during which the gate voltage transitionally changes, the gate voltage having temperature dependency on a chip temperature of the voltage-controlled semiconductor element;
   a one-shot circuit connected to the delay circuit, the one-shot circuit being configured to output a pulse signal with a pulse width shorter than the Miller effect period; and
   a sample-hold circuit that receives the gate voltage while receiving the pulse signal, and holds to output the received gate voltage until the receiving of the pulse signal ends.

4. The drive device for driving the voltage-controlled semiconductor element according to claim 3, further comprising a chip temperature output terminal that outputs a chip temperature detection signal, which is an output of the sample-hold circuit.

5. A drive device for driving a voltage-controlled semiconductor element having a gate, the drive device comprising:
   a drive circuit that is connected to the gate of the voltage-controlled semiconductor element via a gate resistor provided therebetween;
   a delay circuit connected to the drive circuit, the delay circuit being configured to delay a drive signal output from the drive circuit by a predetermined period of time until a gate voltage of the voltage-controlled semiconductor element enters a Miller effect period, the Miller effect period being a period during which the gate voltage transitionally changes, the gate voltage having temperature dependency on a chip temperature of the voltage-controlled semiconductor element;
   a one-shot circuit connected to the delay circuit, the one-shot circuit being configured to output a pulse signal with a pulse width shorter than the Miller effect period;
   a comparator that compares the gate voltage with a reference voltage;

an AND circuit that receives the pulse signal output from the one-shot circuit and an output signal of the comparator, and outputs an overheat detection signal in response to the output signal indicating that the gate voltage exceeds the reference voltage; and a sample-hold circuit that receives the gate voltage while receiving the pulse signal, and holds to output the received gate voltage until the receiving of the pulse signal ends.

6. The drive device for driving the voltage-controlled semiconductor element according to claim 5, further comprising:

an alarm output terminal that outputs the overheat detection signal generated by the AND circuit; and a chip temperature output terminal that outputs a chip temperature detection signal, which is an output of the sample-hold circuit.

* * * * *